United States Patent
Emura et al.

(10) Patent No.: US 12,206,052 B2
(45) Date of Patent: Jan. 21, 2025

(54) LIGHT-EMITTING DEVICE AND PLANAR LIGHT SOURCE THAT UTILIZES MULTIPLE WAVELENGTH CONVERSION LAYERS

(71) Applicant: NICHIA CORPORATION, Anan (JP)

(72) Inventors: Keiji Emura, Anan (JP); Tsuyoshi Okahisa, Tokushima (JP)

(73) Assignee: NICHIA CORPORATION, Anan (JP)

( * ) Notice: Subject to any disclaimer, the term of this patent is extended or adjusted under 35 U.S.C. 154(b) by 482 days.

(21) Appl. No.: 17/456,986

(22) Filed: Nov. 30, 2021

(65) Prior Publication Data

US 2022/0173283 A1 Jun. 2, 2022

(30) Foreign Application Priority Data

Nov. 30, 2020 (JP) .................. 2020-198537
Dec. 22, 2020 (JP) .................. 2020-212893

(Continued)

(51) Int. Cl.
*H01L 33/50* (2010.01)
*H01L 27/15* (2006.01)
(Continued)

(52) U.S. Cl.
CPC .......... *H01L 33/504* (2013.01); *H01L 27/156* (2013.01); *H01L 33/10* (2013.01); *H01L 33/62* (2013.01)

(58) Field of Classification Search
None
See application file for complete search history.

(56) References Cited

U.S. PATENT DOCUMENTS

2010/0044735 A1 2/2010 Oyamada
2010/0237370 A1* 9/2010 Kim ................ H01L 33/504
257/E33.061

(Continued)

FOREIGN PATENT DOCUMENTS

JP 2005123560 A 5/2005
JP 2009094207 A 4/2009
(Continued)

*Primary Examiner* — Scott B Geyer
(74) *Attorney, Agent, or Firm* — Hunton Andrews Kurth LLP

(57) ABSTRACT

A light-emitting device includes: a light-emitting element emitting a first light having a first peak wavelength; a first wavelength conversion member contacting a side surface of the light-emitting element and including a wavelength conversion material absorbing at least a portion of the first light and emitting a second light having a second peak wavelength different from the first peak wavelength; a second wavelength conversion member on the first wavelength conversion member, the second wavelength conversion member including a wavelength conversion material absorbing at least a portion of the first light and emitting a third light having a third peak wavelength different from the first and second peak wavelengths; and a first light-reflective member on the second wavelength conversion member and at least on the light-emitting element. A continuous light-emitting surface includes a side surface of the first wavelength conversion member and a side surface of the second wavelength conversion member.

18 Claims, 10 Drawing Sheets

(30) Foreign Application Priority Data

Feb. 25, 2021 (JP) .............................. 2021-028860
Sep. 7, 2021 (JP) .............................. 2021-145099

(51) Int. Cl.
*H01L 33/10* (2010.01)
*H01L 33/62* (2010.01)

(56) References Cited

U.S. PATENT DOCUMENTS

| | | |
|---|---|---|
| 2011/0102706 A1 | 5/2011 | Oshio |
| 2011/0156071 A1* | 6/2011 | Cheng ..................... H01L 33/44 257/E33.056 |
| 2012/0267659 A1* | 10/2012 | Chou ..................... H01L 33/505 257/E33.061 |
| 2012/0305970 A1* | 12/2012 | Kim ..................... H01L 33/504 257/E33.072 |
| 2013/0193839 A1 | 8/2013 | Kobayashi |
| 2014/0054619 A1* | 2/2014 | Tseng ..................... H01L 33/504 438/27 |
| 2014/0291610 A1* | 10/2014 | Tseng ..................... H01L 33/505 257/98 |
| 2014/0319553 A1* | 10/2014 | Ye ......................... G02B 5/283 257/89 |
| 2015/0085527 A1* | 3/2015 | Nam ..................... H01L 33/505 438/27 |
| 2015/0179901 A1* | 6/2015 | Ok ......................... H01L 33/504 257/98 |
| 2015/0188000 A1* | 7/2015 | Huang .................. H01L 33/60 257/98 |
| 2016/0240746 A1* | 8/2016 | Yun ........................ H01L 33/56 |
| 2017/0309793 A1* | 10/2017 | Seo ........................ H01L 33/62 |
| 2018/0006196 A1* | 1/2018 | Linkov .................. H01L 33/60 |
| 2018/0040786 A1* | 2/2018 | Chen ..................... H01L 33/505 |
| 2018/0198031 A1* | 7/2018 | Kim ....................... H01L 33/54 |
| 2019/0027655 A1 | 1/2019 | Pindl et al. |
| 2019/0081219 A1* | 3/2019 | Chen ..................... H01L 33/504 |
| 2019/0198735 A1* | 6/2019 | Tsai ....................... H01L 33/54 |
| 2019/0267524 A1* | 8/2019 | Bohmer ................ H01L 33/50 |
| 2019/0301709 A1* | 10/2019 | Chen ..................... C09K 11/02 |
| 2019/0324327 A1* | 10/2019 | Moon .................. G02F 1/133603 |
| 2020/0075815 A1* | 3/2020 | Bechtel ................ H01L 33/504 |
| 2020/0091379 A1* | 3/2020 | Jung ..................... C09K 11/7715 |
| 2020/0105973 A1 | 4/2020 | Kasai et al. |
| 2020/0127174 A1* | 4/2020 | Zhong ................. H01L 33/504 |
| 2020/0144466 A1* | 5/2020 | Endo ..................... H01L 33/62 |
| 2020/0313047 A1* | 10/2020 | Yamada ................ H01L 33/56 |
| 2020/0379165 A1 | 12/2020 | Hayashi |
| 2021/0036198 A1 | 2/2021 | Nakabayashi et al. |
| 2021/0265540 A1* | 8/2021 | Itou ....................... H01L 33/62 |
| 2023/0154967 A1* | 5/2023 | Pilkington ............ H01L 27/156 257/40 |

FOREIGN PATENT DOCUMENTS

| | | |
|---|---|---|
| JP | 2010050404 A | 3/2010 |
| JP | 2010080935 A | 4/2010 |
| JP | 2010272687 A | 12/2010 |
| JP | 2013089645 A | 5/2013 |
| JP | 2013118244 A | 6/2013 |
| JP | 2013149711 A | 8/2013 |
| JP | 2013157397 A | 8/2013 |
| JP | 2016533030 A | 10/2016 |
| JP | 2019020733 A | 2/2019 |
| JP | 2020057748 A | 4/2020 |
| JP | 2020107865 A | 7/2020 |
| JP | 2020181879 A | 11/2020 |
| JP | 2020198421 A | 12/2020 |
| JP | 2021027129 A | 2/2021 |
| WO | 2015013399 A1 | 1/2015 |

* cited by examiner

LIGHT-EMITTING DEVICE AND PLANAR LIGHT SOURCE THAT UTILIZES MULTIPLE WAVELENGTH CONVERSION LAYERS

CROSS-REFERENCE TO RELATED APPLICATIONS

This application is based upon and claims the benefit of priority from the prior Japanese Patent Application No. 2020-198537, filed on Nov. 30, 2020; the entire contents of which are incorporated herein by reference.

This application is based upon and claims the benefit of priority from the prior Japanese Patent Application No. 2021-145099, filed on Sep. 7, 2021; the entire contents of which are incorporated herein by reference.

This application is based upon and claims the benefit of priority from the prior Japanese Patent Application No. 2020-212893, filed on Dec. 22, 2020; the entire contents of which are incorporated herein by reference.

This application is based upon and claims the benefit of priority from the prior Japanese Patent Application No. 2021-028860, filed on Feb. 25, 2021; the entire contents of which are incorporated herein by reference.

FIELD

Embodiments relate to a light-emitting device and a planar light source.

BACKGROUND

In recent years, light-emitting devices are being developed in which a wavelength conversion material is bonded with a light-emitting diode (LED). It is desirable to increase the luminous efficiency of such a light-emitting device.

SUMMARY

According to an aspect of the present disclosure, a light-emitting device includes a light-emitting element, a first wavelength conversion member, a second wavelength conversion member, and a first light-reflective member. The light-emitting element emits a first light. The first light has a first peak wavelength. The first wavelength conversion member contacts a side surface of the light-emitting element. The first wavelength conversion member includes a wavelength conversion material that absorbs at least a portion of the first light and emits a second light. The second light has a second peak wavelength different from the first peak wavelength. The second wavelength conversion member is located on the first wavelength conversion member. The second wavelength conversion member includes a wavelength conversion material that absorbs at least a portion of the first light and emits a third light. The third light has a third peak wavelength different from the first peak wavelength and the second peak wavelength. The first light-reflective member is located on the second wavelength conversion member. The first light-reflective member is located at least on the light-emitting element. A side surface of the first wavelength conversion member and a side surface of the second wavelength conversion member are included in a continuous light-emitting surface.

According to an aspect of the present disclosure, a planar light source includes a plurality of the light-emitting devices according to the present disclosure, and a light guide plate including a plurality of holes. The plurality of light-emitting devices are positioned respectively in the plurality of holes.

DETAILED DESCRIPTION

Figure 1A:
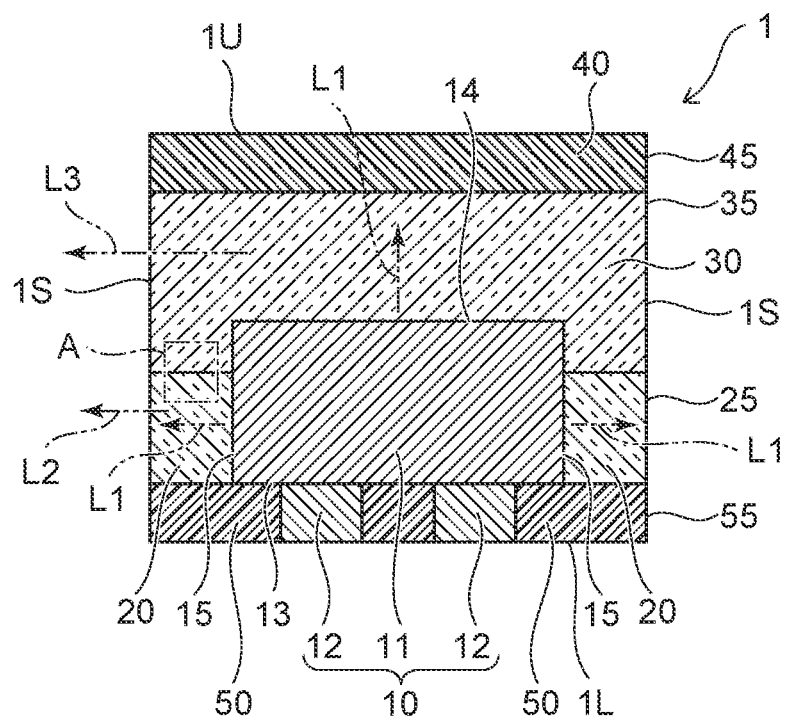
FIG. 1A is a cross-sectional view showing an exemplary light-emitting device according to a first embodiment of the present disclosure.

Exemplary embodiments will now be described in detail with reference to the drawings. Embodiments described below are examples; and the light-emitting devices and planar light sources according to embodiments of the invention are not limited to the embodiments described below. For example, the numerical values, the shapes, the materials, the processes, the sequence of the processes, etc., shown in the embodiments described below are merely examples; and various modifications within the limits of technical feasibility are possible. Various combinations of the embodiments described below are possible within the limits of technical feasibility.

The dimensions, the shapes, etc., of the components shown in the drawings may be exaggerated for easier understanding and may not reflect the actual dimensions, shapes, and size relationships between the components. For example, the aspect ratio may be illustrated differently between the drawings even for the same component. Schematic views in which a portion of the components is not illustrated are used to avoid excessive complexity of the drawings; and end views that show only cross sections may be used as cross-sectional views.

First Embodiment

The configuration of an exemplary light-emitting device 1 according to the first embodiment will now be described.

FIG. 1A is a cross-sectional view showing the exemplary light-emitting device according to the first embodiment.

Figure 1B:
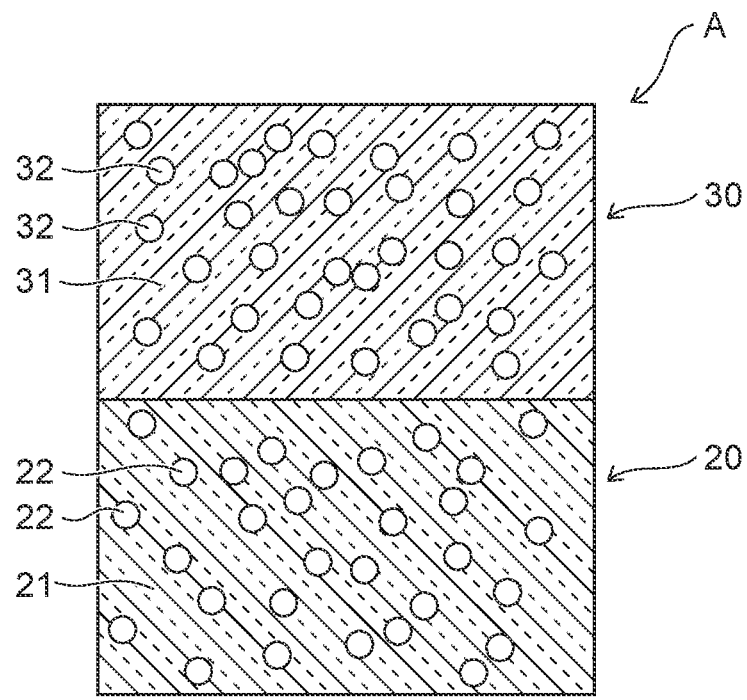
FIG. 1B is a cross-sectional view showing region A in FIG. 1A.

FIG. 1B is a cross-sectional view showing region A in FIG. 1A.

As shown in FIG. 1A, the shape of the light-emitting device 1 according to the embodiment is a substantially rectangular parallelepiped. In other words, the light-emitting device 1 includes a lower surface 1L, an upper surface 1U, and four side surfaces 1S located between the lower surface 1L and the upper surface 1U. The light-emitting device 1 includes a light-emitting element 10, a first wavelength conversion member 20, a second wavelength conversion member 30, a first light-reflective member 40, and a cover member 50.

The light-emitting element 10 includes a semiconductor structure body 11, and a positive and negative pair of electrodes 12 electrically connected to the semiconductor structure body 11. The shape of the semiconductor structure body 11 is, for example, a rectangular parallelepiped. At least a p-type semiconductor layer, a light-emitting layer, and an n-type semiconductor layer are stacked in the semiconductor structure body 11. One of the electrodes 12 is connected to the p-type semiconductor layer of the semiconductor structure body 11; and the other electrode 12 is connected to the n-type semiconductor layer of the semiconductor structure body 11. The material of the electrode 12 includes, for example, silver (Ag) or copper (Cu). The electrode 12 may be a single layer or may be multiple layers that include different metal layers.

Although the direction from the pair of electrodes 12 toward the semiconductor structure body 11 is called "up" and the opposite direction is called "down" in the specification, these expressions are for convenience and are independent of the direction of gravity. A direction orthogonal to "up" and "down" also is called a "horizontal direction". In the specification, "when viewed in plan" or "a plan view" refers to a view from above or below.

In the light-emitting element 10, the surface (the electrode formation surface) at which the pair of electrodes 12 is located is taken as a lower surface 13; the surface opposite to the lower surface 13 is taken as an upper surface 14; and the surface between the lower surface 13 and the upper surface 14 is taken as a side surface 15. Four side surfaces 15 exist when the shape of the semiconductor structure body 11 is a rectangular parallelepiped. The light-emitting element 10 emits a first light L1 that has a first peak wavelength. For example, the first peak wavelength is in a visible light region. For example, the first peak wavelength is in a blue region. The first peak wavelength may be in a visible light region other than blue light and may be in an ultraviolet region.

The first wavelength conversion member 20 contacts a region of the side surface 15 of the light-emitting element 10 other than a region proximate to the upper surface 14. That is, the first wavelength conversion member 20 is apart from the upper surface 14. However, an adhesive layer may be located between the first wavelength conversion member 20 and the side surface 15 of the light-emitting element 10.

As shown in FIGS. 1A and 1B, the first wavelength conversion member 20 includes a transmissive resin 21 as a base material, and a wavelength conversion material 22 in the base material. The wavelength conversion material 22 is, for example, a fluorescer. The wavelength conversion material 22 absorbs at least a portion of the first light L1 emitted from the light-emitting element 10 and emits a second light L2 having a second peak wavelength that is different from the first peak wavelength. For example, the second peak wavelength is in a green region. The wavelength conversion material 22 is, for example, a β-sialon fluorescer (e.g., (Si, Al)$_3$(O, N)$_4$:Eu).

The second wavelength conversion member 30 is located on the light-emitting element 10 and on the first wavelength conversion member 20. The second wavelength conversion member 30 contacts the upper surface 14 and a region of the side surface 15 of the light-emitting element 10 proximate to the upper surface 14. That is, the second wavelength conversion member 30 covers an upper portion of the light-emitting element 10. However, an adhesive layer may be located between the second wavelength conversion member 30 and the upper surface 14 of the light-emitting element 10. An adhesive layer also may be located between the second wavelength conversion member and the side surface 15 of the light-emitting element 10.

The second wavelength conversion member 30 includes a transmissive resin 31 as a base material, and a wavelength conversion material 32 in the base material. The wavelength conversion material 32 is, for example, a fluorescer. The wavelength conversion material 32 absorbs at least a portion of the first light L1 emitted from the light-emitting element 10 and emits a third light L3 having a third peak wavelength that is different from the first and second peak wavelengths. For example, the third peak wavelength is in a red region. The wavelength conversion material 32 includes or is, for example, a fluoride fluorescer. The fluoride fluorescer includes or is, for example, a KSF fluorescer (e.g., K$_2$SiF$_6$:Mn).

The first light-reflective member 40 is located on the second wavelength conversion member 30, and is located at least on the light-emitting element 10. In FIG. 1A, the first light-reflective member 40 is positioned above the light-emitting element 10 and located on the second wavelength conversion member 30. The first light-reflective member 40 reflects a portion of the first light L1, a portion of the second light L2, and a portion of the third light L3. Also, the first light-reflective member 40 transmits another portion of the first light L1, another portion of the second light L2, and another portion of the third light L3. The first light-reflective member 40 includes, for example, a light-diffusing material in a base material made of a resin.

The cover member 50 covers the lower surface of the first wavelength conversion member 20, the side surface of the electrode 12, and the region of the lower surface 13 of the light-emitting element 10 other than the electrodes 12. The cover member 50 is, for example, light-reflective. The cover member 50 includes, for example, a light-diffusing material in a base material made of a resin. By providing the cover member 50, the cover member 50 reflects the light emitted from the light-emitting element 10 toward the lower surface 13 side; and the light extraction efficiency of the light-emitting element can be increased. The cover member 50 may not be provided.

Among the surfaces of the light-emitting element 10, the lower surfaces of the electrodes 12 are exposed at the lower surface 1L of the light-emitting device 1. Other than the lower surfaces of the electrodes 12, the surfaces of the light-emitting element 10 are covered with the cover member 50, the first wavelength conversion member 20, and the second wavelength conversion member 30. The upper surface 1U of the light-emitting device 1 includes the upper surface of the first light-reflective member 40. The lower surface 1L of the light-emitting device 1 includes the lower surface of the cover member 50 and the lower surfaces of the pair of electrodes 12. The side surface 1S of the light-emitting device 1 includes a side surface 55 of the cover member 50, a side surface 25 of the first wavelength conversion member 20, a side surface 35 of the second wavelength conversion member 30, and a side surface 45 of the first light-reflective member 40.

Thereby, the side surface 25 of the first wavelength conversion member 20 and the side surface 35 of the second wavelength conversion member 30 are included in a continuous light-emitting surface. "Continuous" refers to being substantially flat without a step at the boundary.

The light-emitting device 1 can include metal films at the lower surfaces of the pair of electrodes 12. In such a case, it is favorable for the metal films to cover the lower surface of the cover member 50 at the periphery of the lower surfaces of the electrodes 12 in addition to the lower surfaces of the electrodes 12. That is, it is favorable for the surface areas of the lower surfaces of the metal films to be greater than the surface areas of the lower surfaces of the electrodes 12. The electrical connection between the light-emitting device 1 and the wiring substrate on which the light-emitting device 1 is mounted is improved thereby. For example, the metal films can be formed as follows. A metal film is sputtered on the lower surfaces of the electrodes 12 and the lower surface of the cover member 50; and the metal film is locally removed by laser ablation so that the electrodes 12 are electrically isolated from each other. Also, as another example, a mask that has openings at the lower surfaces of the electrodes 12 and at a portion of the lower surface of the cover member 50 may be provided, a conductive paste may be disposed in the regions of the openings, and the mask may be subsequently removed.

A method for manufacturing the light-emitting device 1 according to the embodiment will now be described.

FIGS. 2A to 2H are cross-sectional views showing an exemplary method for manufacturing a light-emitting device according to the first embodiment.

Figure 2A:
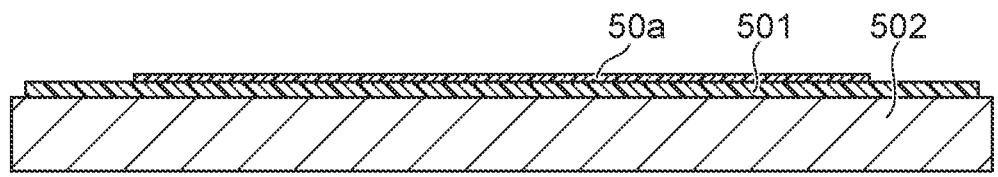
FIGS. 2A to 2H are cross-sectional views showing an exemplary method for manufacturing a light-emitting device according to the first embodiment.

First, as shown in FIG. 2A, a sheet 501 that is made of, for example, a resin is prepared, and a reflecting resin layer 50a is disposed on the sheet 501. At this stage, the reflecting resin layer 50a is uncured. Then, the lower surface of the sheet 501 is adhered to a plate 502.

Figure 2B:
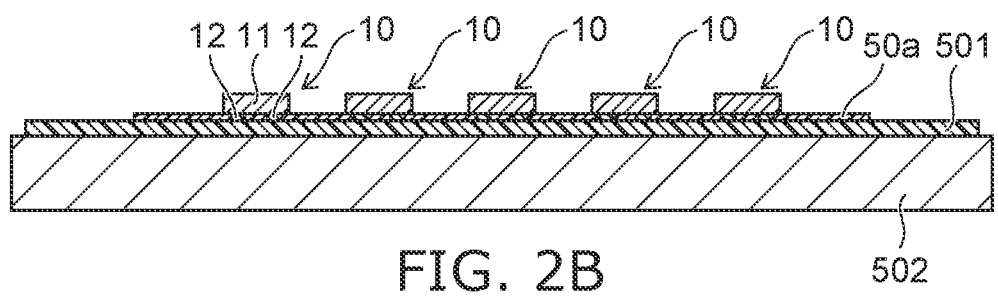

Then, as shown in FIG. 2B, the multiple light-emitting elements 10 are disposed on the reflecting resin layer 50a so that the electrodes 12 face the reflecting resin layer 50a. Then, the light-emitting elements 10 naturally settle into the reflecting resin layer 50a, or the light-emitting elements 10 are pressed toward the reflecting resin layer 50a. Thereby, the electrodes 12 of the light-emitting elements 10 are located in the reflecting resin layer 50a. At this time, the electrodes 12 of the light-emitting elements 10 are surrounded with the reflecting resin layer 50a. Then, the reflecting resin layer 50a is cured by, for example, heat treatment, etc. The heat treatment that cures the resin includes, for example, a process of heating in an oven at a temperature of 60° C. to 130° C.

Figure 2C:
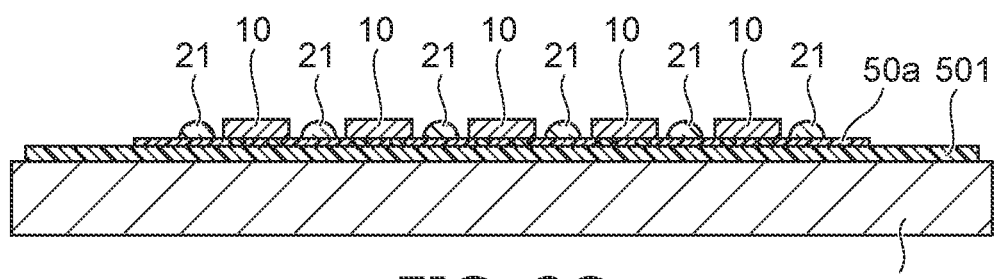

Continuing as shown in FIG. 2C, the resin 21 that includes the wavelength conversion material 22 is disposed in the region between the light-emitting elements 10 on the reflecting resin layer 50a. The resin 21 surrounds the light-emitting elements in a plan view. At this stage, the resin 21 is uncured. At this time, the supply amount of the resin 21 is such that the upper surface of the resin 21 is positioned lower than the upper surfaces 14 of the light-emitting elements 10 when the supplied resin 21 is planarized.

Figure 2D:
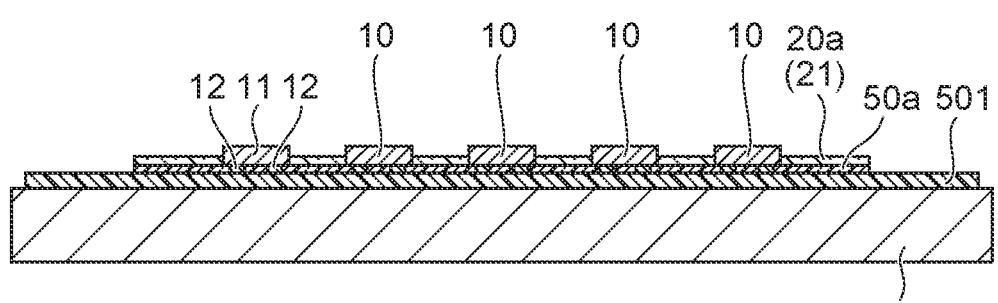

Then, the resin 21 is planarized as shown in FIG. 2D. Thereby, the region of the side surface of the semiconductor structure body 11 of the light-emitting element 10 proximate to the electrode formation surface (the lower surface 13) is covered with the resin 21; and the region of the side surface of the semiconductor structure body 11 proximate to the upper surface 14 is externally exposed. The upper surface 14 of the light-emitting element 10 is externally exposed. Then, the resin 21 is cured by, for example, heat treatment, etc. A first wavelength conversion layer 20a is formed thereby. The first wavelength conversion layer 20a includes the wavelength conversion material 22 in the resin 21. The portion of the side surface of the semiconductor structure body 11 of the light-emitting element 10 proximate to the electrode formation surface is surrounded with the first wavelength conversion layer 20a. The planarizing of the resin 21 may be performed by spreading by natural wetting of the resin 21; the wetting and spreading of the resin 21 may be performed by vibrating the plate 502; or the surface of the resin 21 may be planarized using a jig, etc.

Figure 2E:
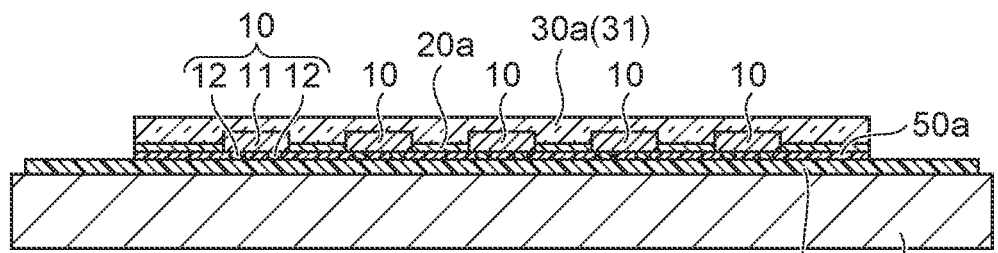

Continuing as shown in FIG. 2E, the resin 31 that includes the wavelength conversion material 32 is disposed on the first wavelength conversion layer 20a. At this stage, the resin 31 is uncured. The resin 31 buries the light-emitting elements 10. Then, the resin 31 is cured by, for example, heat treatment, etc. Thereby, a second wavelength conversion layer 30a is formed on the first wavelength conversion layer 20a. The second wavelength conversion layer 30a includes the wavelength conversion material 32 in the resin 31. The upper surface 14 of the light-emitting element 10 and the region of the side surface of the semiconductor structure body 11 of the light-emitting element 10 that is not covered with the first wavelength conversion layer 20a are covered with the second wavelength conversion layer 30a.

Figure 2F:
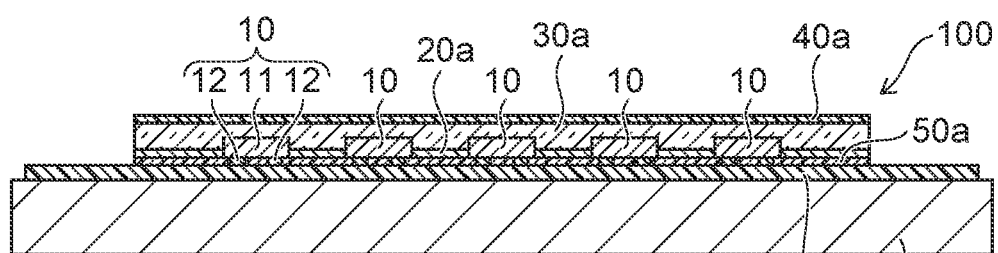

Then, as shown in FIG. 2F, a resin that includes a light-diffusing material is disposed on the second wavelength conversion layer 30a. Then, the resin is cured by, for example, heat treatment, etc. A first light-reflecting layer 40a is formed thereby. Thus, a structure body 100 is made by stacking the reflecting resin layer 50a, the first wavelength conversion layer 20a, the second wavelength conversion layer 30a, and the first light-reflecting layer 40a to include the multiple light-emitting elements 10 inside the structure body 100.

Figure 2G:
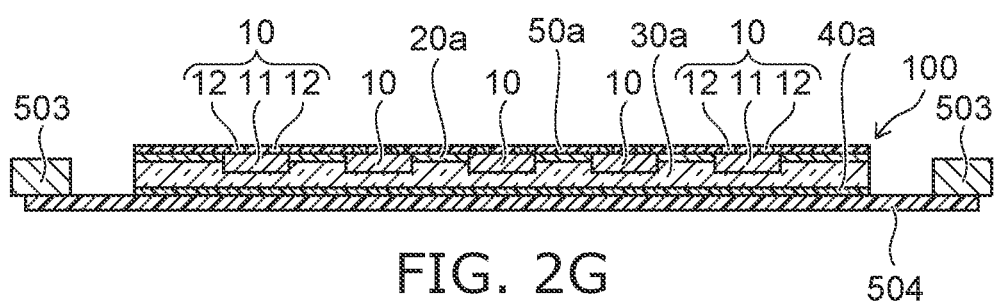

Continuing as shown in FIG. 2G, a supporter in which a sheet 504 is stretched over a ring 503 is prepared. Then, the structure body 100 is transferred from the sheet 501 to the sheet 504 by bonding the first light-reflecting layer 40a to the sheet 504. At this time, the structure body 100 is vertically inverted, and the reflecting resin layer 50a is exposed upward. Then, the electrodes 12 of the light-emitting elements 10 are exposed at the surface of the reflecting resin layer 50a by polishing the reflecting resin layer 50a.

Figure 2H:
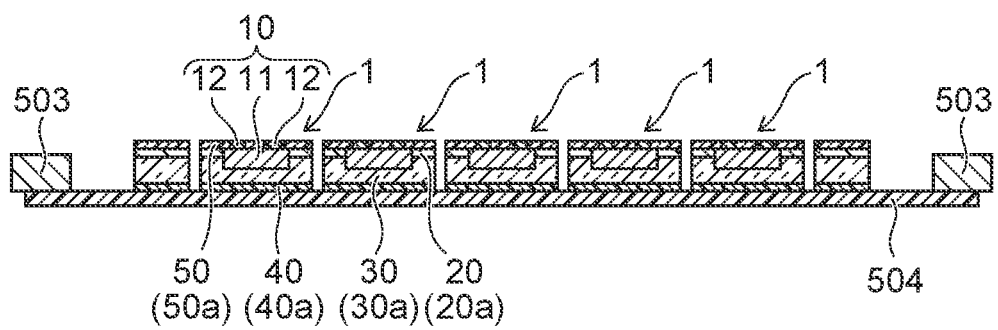

Then, as shown in FIG. 2H, the structure body 100 is cut between the adjacent light-emitting elements 10. When the structure body 100 includes the light-emitting elements 10 that are two-dimensionally arranged, the structure body 100 can be cut in a lattice shape. The structure body 100 can be singulated into the light-emitting elements 10 thereby, and the multiple light-emitting devices 1 are manufactured. At this time, the reflecting resin layer 50a is subdivided to become the cover member 50; the first wavelength conversion layer 20a is subdivided to become the first wavelength conversion member 20; the second wavelength conversion layer 30a is subdivided to become the second wavelength conversion member 30; and the first light-reflecting layer 40a is subdivided to become the first light-reflective member 40. Although one light-emitting element 10 is provided in each light-emitting device 1 according to the embodiment, the light-emitting device 1 is not limited thereto; multiple light-emitting elements may be provided in one light-emitting device.

Operations of the light-emitting device 1 according to the embodiment will now be described.

When electrical power is supplied to the light-emitting element 10 of the light-emitting device 1 via a wiring substrate 110, the light-emitting element 10 emits the first light L1. A portion of the first light L1 enters the first wavelength conversion member 20 and is converted into the second light L2 by the wavelength conversion material 22. Another portion of the first light L1 enters the second wavelength conversion member 30 and is converted into the third light L3 by the wavelength conversion material 32. Yet another portion of the first light L1 passes through the first wavelength conversion member 20 or the second wavelength conversion member 30 and is emitted out of the light-emitting device 1. The greater part of the second light L2 is emitted out of the light-emitting device 1 through the side surface 25 of the first wavelength conversion member 20. The greater part of the third light L3 is emitted out of the light-emitting device 1 through the side surface 35 of the second wavelength conversion member 30. At this time, the light that passes through the second wavelength conversion member 30 and reaches the first light-reflective member 40 is reflected by the first light-reflective member 40; the radiation of the light through the upper surface 1U of the light-emitting device 1 is suppressed thereby, and the radiation of the light through the side surface 1S is increased.

Thereby, mixed light of the first light L1, the second light L2, and the third light L3 is emitted from the light-emitting device 1. For example, the first light L1 is blue light; the second light L2 is green light; the third light L3 is red light; and the mixed light is white light. Because the light through the upper surface 1U of the light-emitting device 1 is suppressed and the light through the side surface 1S is increased, a batwing light distribution characteristic is easily obtained. Here, a batwing light distribution characteristic is broadly defined as the light distribution characteristic of a light emission intensity distribution in which an optical axis perpendicular to the upper surface of the light-emitting element is taken as 0°, and the light emission intensity is high when the absolute value of the light distribution angle from 0° is large.

Effects of the embodiment will now be described.

In the light-emitting device 1 according to the embodiment, the first wavelength conversion member 20 contacts the side surface 15 of the light-emitting element 10. Therefore, a portion of the light L1 emitted from the light-emitting element 10 directly enters the first wavelength conversion member 20 and is converted into the light L2 by the wavelength conversion material 22. Therefore, the conversion efficiency of the light L1 into the light L2 is high.

Similarly, the second wavelength conversion member 30 contacts the upper surface 14 of the light-emitting element 10 and the region of the side surface of the semiconductor structure body 11 of the light-emitting element 10 not covered with the first wavelength conversion layer 20a. Therefore, a portion of the light L1 emitted from the light-emitting element 10 directly enters the second wavelength conversion member 30 and is converted into the light L3 by the wavelength conversion material 32. Therefore, the conversion efficiency of the light L1 into the light L3 also is high.

The first wavelength conversion member 20 and the second wavelength conversion member 30 are exposed at the side surface 1S of the light-emitting device 1. Thereby, the greater part of the second light L2 generated by the first wavelength conversion member 20 is emitted sideward of the light-emitting device 1 through the side surface 1S of the light-emitting device 1 without passing through the second wavelength conversion member 30. Therefore, the scattering of the second light L2 scattered by the second wavelength conversion member is low. Also, the greater part of the third light L3 generated by the second wavelength conversion member 30 is emitted sideward of the light-emitting device 1 through the side surface 1S of the light-emitting device 1 without passing through the first wavelength conversion member 20. Therefore, the scattering of the third light L3 by the first wavelength conversion member 20 is low.

Thus, in the light-emitting device 1, only one layer of wavelength conversion members is provided in the horizontal direction when viewed from the light-emitting element 10; therefore, compared to the case where two or more layers of wavelength conversion members overlap each other in the horizontal direction when viewed from the light-emitting element 10, the path from the light-emitting element 10 to the side surface 1S of the light-emitting device 1 is short. Therefore, the light is not easily scattered. Also, a portion of the light from the light-emitting element 10 that reaches the first light-reflective member 40 is scattered by the first light-reflective member 40. The scattered portion of the light is emitted through the side surface 1s of the light-emitting device 1. As a result, in the light-emitting device 1, the extraction efficiency of the second light L2 and the third light L3 is high. Therefore, the luminous efficiency of the light-emitting device 1 is high.

There are cases where a KSF fluorescer (e.g., $K_2SiF_6$:Mn) is used as the wavelength conversion material 32 of the second wavelength conversion member 30 in the light-emitting device 1.

According to the embodiment, the second wavelength conversion member 30 is separated from the electrodes 12 with the first wavelength conversion member 20 and the cover member 50 interposed. Therefore, when the light-emitting device 1 is driven in a high-temperature high-humidity environment, even when potassium ions and fluorine ions that are included in the KFS fluorescer are freed, the ions that reach the electrodes 12 can be reduced. The migration of the metal ions included in the electrodes 12 can be suppressed thereby, and the corrosion of the electrodes 12 is suppressed. The second wavelength conversion member 30 also is separated from the interface between the semiconductor structure body 11 and the cover member 50. Therefore, the potassium ions and the fluorine ions that diffuse through the interface between the semiconductor structure body 11 and the cover member 50 and reach the electrodes 12 also can be suppressed, and the corrosion of the electrodes 12 is suppressed. Because the second wavelength conversion member 30 contacts the light-emitting element 10, the heat that is generated when the fluorescer of the second wavelength conversion member 30 performs wavelength conversion can be dissipated to the mounting substrate side via the light-emitting element. As a result, the reliability of the light-emitting device 1 is high.

Instead of a β-sialon fluorescer, a YAG (Yttrium Aluminum Garnet) fluorescer may be used as the wavelength conversion material 22 of the first wavelength conversion member 20. In such a case, the second peak wavelength of the second light L2 is in a yellow region.

Second Embodiment

Figure 3:
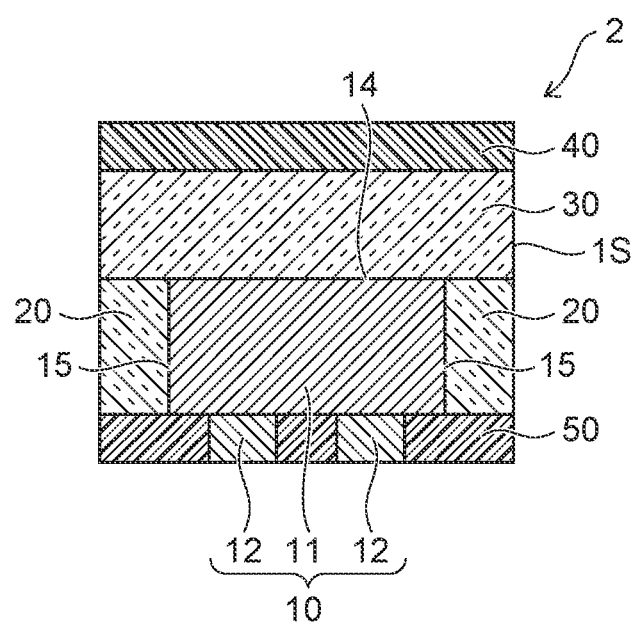
FIG. 3 is a cross-sectional view showing an exemplary light-emitting device according to a second embodiment of the present disclosure.

FIG. 3 is a cross-sectional view showing an exemplary light-emitting device according to the second embodiment of the present disclosure.

Portions that are different from the first embodiment are mainly described in the following description. The configuration, the operations, and the effects other than those described below are similar to those of the first embodiment. This is similar for the other embodiments as well.

In the light-emitting device 2 according to the embodiment as shown in FIG. 3, the first wavelength conversion member 20 contacts substantially the entire side surface 15 of the light-emitting element 10. The second wavelength conversion member 30 also contacts the upper surface 14 of the light-emitting element 10.

A method for manufacturing the light-emitting device 2 according to the embodiment will now be described.

Figure 4A:
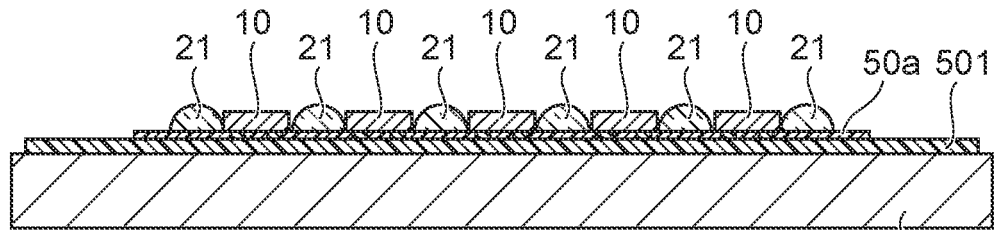
FIGS. 4A to 4C are cross-sectional views showing an exemplary method for manufacturing a light-emitting device according to the second embodiment.
Figure 4B:
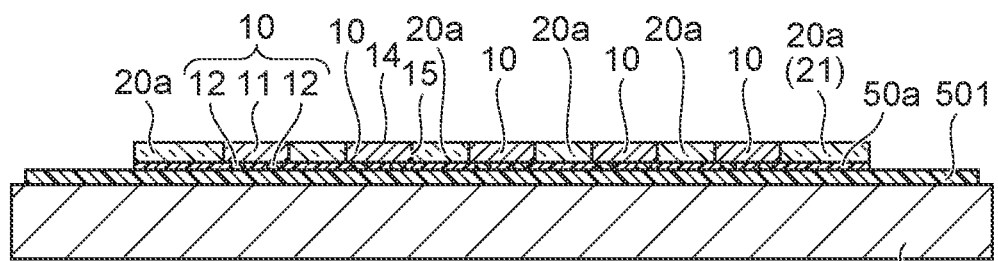
Figure 4C:
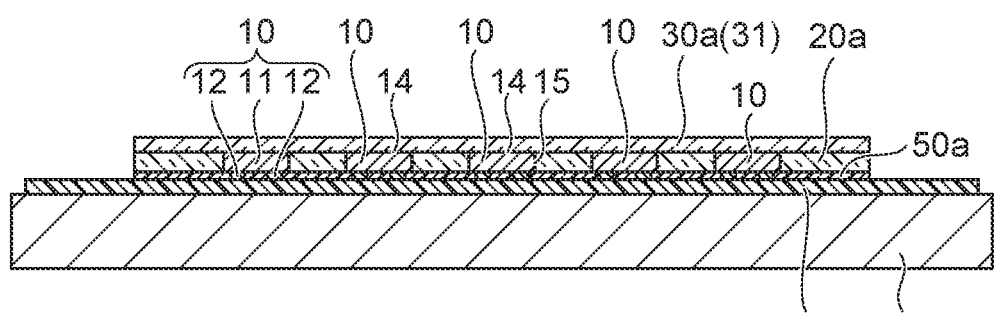

FIGS. 4A to 4C are cross-sectional views showing an exemplary method for manufacturing a light-emitting device according to the second embodiment of the present disclosure.

First, the processes shown in FIGS. 2A and 2B of the first embodiment are performed.

Then, as shown in FIG. 4A, the resin 21 that includes the wavelength conversion material 22 is disposed in the region between the light-emitting elements 10 on the reflecting resin layer 50a. The resin 21 surrounds the light-emitting elements in a plan view. At this stage, the resin 21 is uncured. At this time, the supply amount of the resin 21 is such that the upper surface of the resin 21 is at the same height as the upper surface 14 of the light-emitting element 10 when the supplied resin 21 is planarized.

Then, the resin 21 is planarized as shown in FIG. 4B. At this time, the upper surface of the resin 21 is substantially coplanar with the upper surface of the light-emitting element 10. Thereby, substantially the entire side surface 15 of the light-emitting element 10 is covered with the resin 21. Then, the resin 21 is cured. The first wavelength conversion layer 20a is formed thereby. The first wavelength conversion layer 20a covers substantially the entire side surface 15 of the light-emitting element 10 but does not cover the upper surface 14 of the light-emitting element 10.

Continuing as shown in FIG. 4C, the second wavelength conversion layer 30a is formed on the light-emitting element 10 and on the first wavelength conversion layer 20a. The upper surface 14 of the light-emitting element 10 contacts the second wavelength conversion layer 30a and is covered with the second wavelength conversion layer 30a.

Then, processes similar to the processes shown in FIGS. 2F to 2H of the first embodiment are performed. The multiple light-emitting devices 2 are manufactured thereby.

Effects of the embodiment will now be described.

In the light-emitting device 2 according to the embodiment, compared to the light-emitting device 1 according to the first embodiment, the second wavelength conversion member 30 is separated further from the electrodes 12. Thereby, the corrosion of the electrodes 12 can be further suppressed when a KSF fluorescer is used as the wavelength conversion material 32. According to the embodiment as well, a YAG fluorescer may be used instead of the β-sialon fluorescer as the wavelength conversion material 22 of the first wavelength conversion member 20.

Third Embodiment

Figure 5:
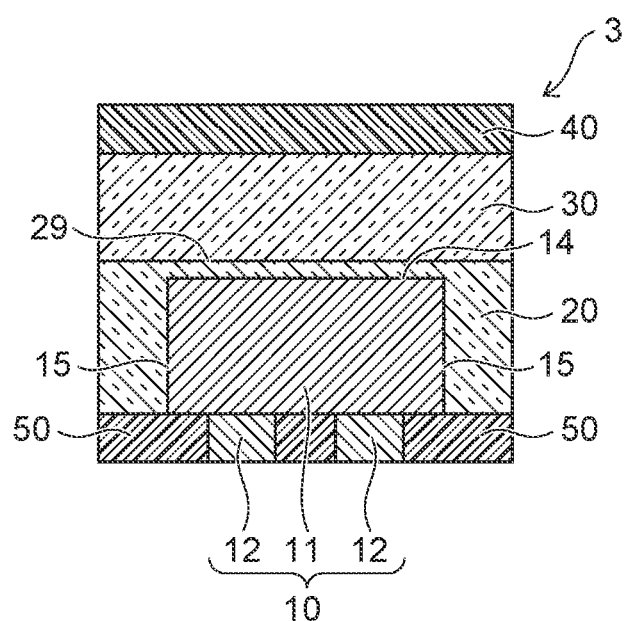
FIG. 5 is a cross-sectional view showing an exemplary light-emitting device according to a third embodiment of the present disclosure.

FIG. 5 is a cross-sectional view showing an exemplary light-emitting device according to the third embodiment.

In the light-emitting device 3 according to the embodiment as shown in FIG. 5, the first wavelength conversion member 20 contacts the side surface 15 and the upper surface 14 of the light-emitting element 10. The second wavelength conversion member 30 is located on the first wavelength conversion member 20. Therefore, the second wavelength conversion member 30 is separated from the light-emitting element 10 and does not contact the light-emitting element 10.

A method for manufacturing the light-emitting device 3 according to the embodiment will now be described.

Figure 6A:
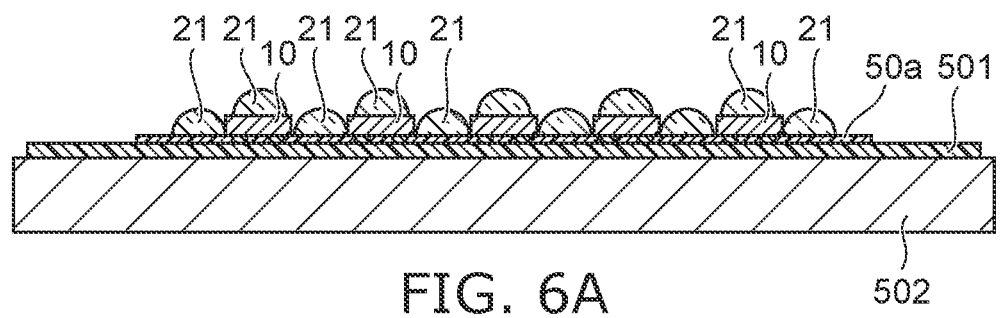
FIGS. 6A to 6C are cross-sectional views showing an exemplary method for manufacturing a light-emitting device according to the third embodiment.
Figure 6B:
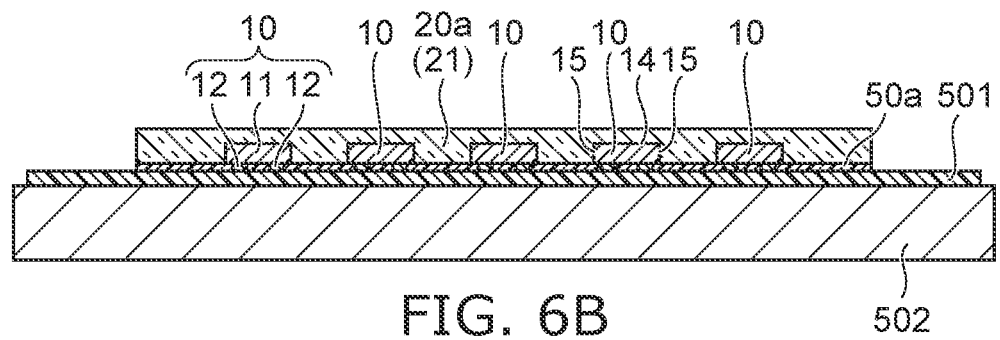
Figure 6C:
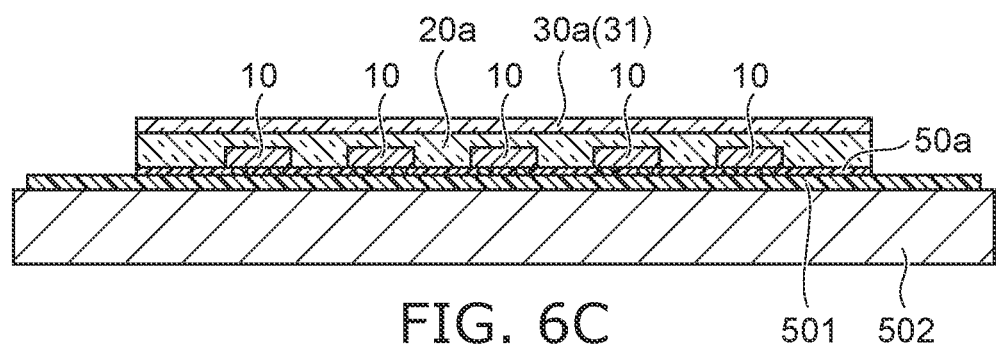

FIGS. 6A to 6C are cross-sectional views showing an exemplary method for manufacturing a light-emitting device according to the third embodiment.

First, the processes shown in FIGS. 2A and 2B of the first embodiment are performed.

Then, as shown in FIG. 6A, the resin 21 that includes the wavelength conversion material 22 is disposed in the region between the light-emitting elements 10 on the light-emitting element 10 and on the reflecting resin layer 50a. The resin 21 surrounds the light-emitting elements 10 in a plan view. At this stage, the resin 21 is uncured. At this time, the supply amount of the resin 21 is such that the upper surface of the resin 21 is positioned higher than the upper surface 14 of the light-emitting element 10 when the supplied resin 21 is planarized.

Continuing as shown in FIG. 6B, the resin 21 is planarized. At this time, the resin 21 covers the upper surface 14 of the light-emitting element 10 and fills the space between the light-emitting elements 10. Thereby, the side surface 15 and the upper surface 14 of the light-emitting element 10 are covered with the resin 21. Then, the resin 21 is cured. The first wavelength conversion layer 20a is formed thereby. The side surface 15 and the upper surface 14 of the light-emitting element are covered with the first wavelength conversion layer 20a.

Then, as shown in FIG. 6C, the second wavelength conversion layer 30a is formed on the first wavelength conversion layer 20a. At this time, the second wavelength conversion layer 30a is separated from the light-emitting elements 10 by the first wavelength conversion layer 20a and does not contact the light-emitting elements 10.

One of the first wavelength conversion member 20 or the second wavelength conversion member 30 may be a light-transmitting member that does not include a wavelength conversion material.

Then, processes similar to the processes shown in FIGS. 2F to 2H of the first embodiment are performed. The multiple light-emitting devices 3 are manufactured thereby.

Effects of the embodiment will now be described.

In the light-emitting device 3 according to the embodiment, an interface 29 between the first wavelength conversion member and the second wavelength conversion member 30 is higher than the light-emitting element 10. Therefore, the first light L1 that is emitted from the light-emitting element 10 is scattered in the first wavelength conversion member 20 and is spread over the entire first wavelength conversion member 20 and second wavelength conversion member 30. Thereby, the conversion efficiency of the light in the second wavelength conversion member 30 is increased because the light amount that travels to the second wavelength conversion member 30 can be prevented from becoming excessive. Also, because the light amount that travels to the second wavelength conversion member 30 is suppressed, the heat that is generated when the fluorescer of the second wavelength conversion member 30 performs wavelength conversion is reduced, and the reliability can be increased.

In the light-emitting device 3, the second wavelength conversion member 30 is separated from the light-emitting element 10; therefore, when a KSF fluorescer is used as the wavelength conversion material 32 of the second wavelength conversion member 30, the potassium ions and the fluorine ions that diffuse along the surface of the light-emitting element 10 and reach the electrodes 12 can be suppressed. The corrosion of the electrodes 12 can be more reliably suppressed thereby.

According to the embodiment as well, a YAG fluorescer may be used instead of the β-sialon fluorescer as the wavelength conversion material 22 of the first wavelength conversion member 20.

Fourth Embodiment

Figure 7:
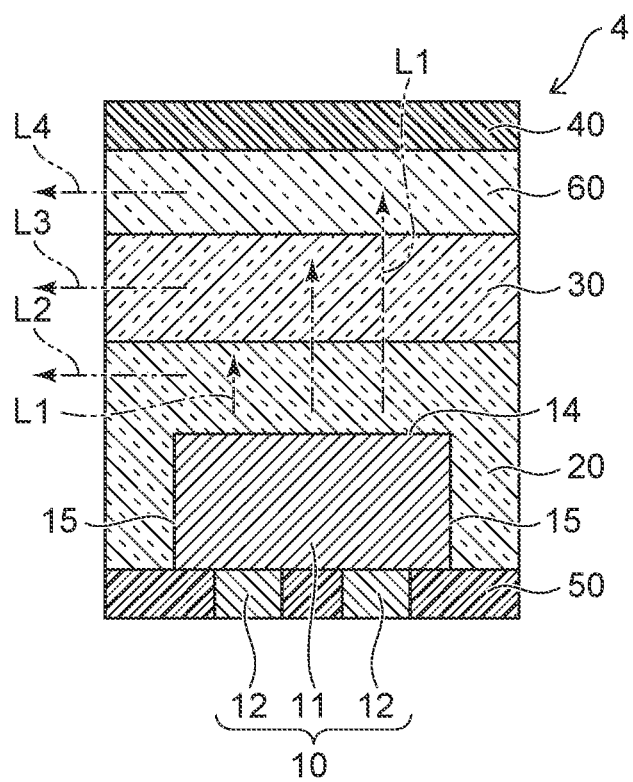
FIG. 7 is a cross-sectional view showing an exemplary light-emitting device according to a fourth embodiment of the present disclosure.

FIG. 7 is a cross-sectional view showing an exemplary light-emitting device according to the fourth embodiment.

As shown in FIG. 7, in addition to the configuration of the light-emitting device 3 according to the third embodiment, a third wavelength conversion member 60 is located between the second wavelength conversion member 30 and the first light-reflective member 40 in the light-emitting device 4 according to the embodiment. The third wavelength conversion member 60 absorbs the first light L1 emitted from the light-emitting element and emits a fourth light L4 that has a fourth peak wavelength. The fourth peak wavelength is different from the first peak wavelength of the first light L1, the second peak wavelength of the second light L2, and the third peak wavelength of the third light L3.

In the light-emitting device 4, the first wavelength conversion member 20 covers the side surface 15 and the upper surface 14 of the light-emitting element 10. The second wavelength conversion member 30 is located on the first wavelength conversion member 20 and is separated from the light-emitting element 10. The third wavelength conversion member 60 is located on the second wavelength conversion member 30 and is separated from the light-emitting element 10 and the first wavelength conversion member 20. The first light-reflective member 40 is located on the third wavelength conversion member 60 and is separated from the light-emitting element 10, the first wavelength conversion member 20, and the second wavelength conversion member 30.

According to the embodiment, for example, the first peak wavelength of the first light L1 emitted by the light-emitting element 10 is in an ultraviolet region. The second peak wavelength of the second light L2 emitted by the first wavelength conversion member 20 is in a blue region. The third peak wavelength of the third light L3 emitted by the second wavelength conversion member 30 is in a red region. The fourth peak wavelength of the fourth light L4 emitted by the third wavelength conversion member 60 is in a green region. Mixed light of the second light L2, the third light L3, and the fourth light L4 is emitted from the light-emitting device 4.

Effects of the embodiment will now be described.

According to the embodiment, the light of the three colors is generated respectively by the wavelength conversion members; therefore, color modulation of all of the light is easy by adjusting the wavelength conversion materials. Therefore, by using the planar light source according to the embodiment as a backlight of a display device (e.g., a liquid crystal display), the color of the image can be more favorably adjusted.

A CASN fluorescer (e.g., CaAlSiN$_3$:Eu) may be used as the wavelength conversion material 22 of the first wavelength conversion member 20. Thereby, the second light L2 that is emitted by the first wavelength conversion member 20 is red light. In such a case, it is favorable for the third light L3 emitted by the second wavelength conversion member 30 to be blue light.

Fifth Embodiment

This embodiment is an embodiment of a planar light source that includes multiple light-emitting devices.

Figure 8:
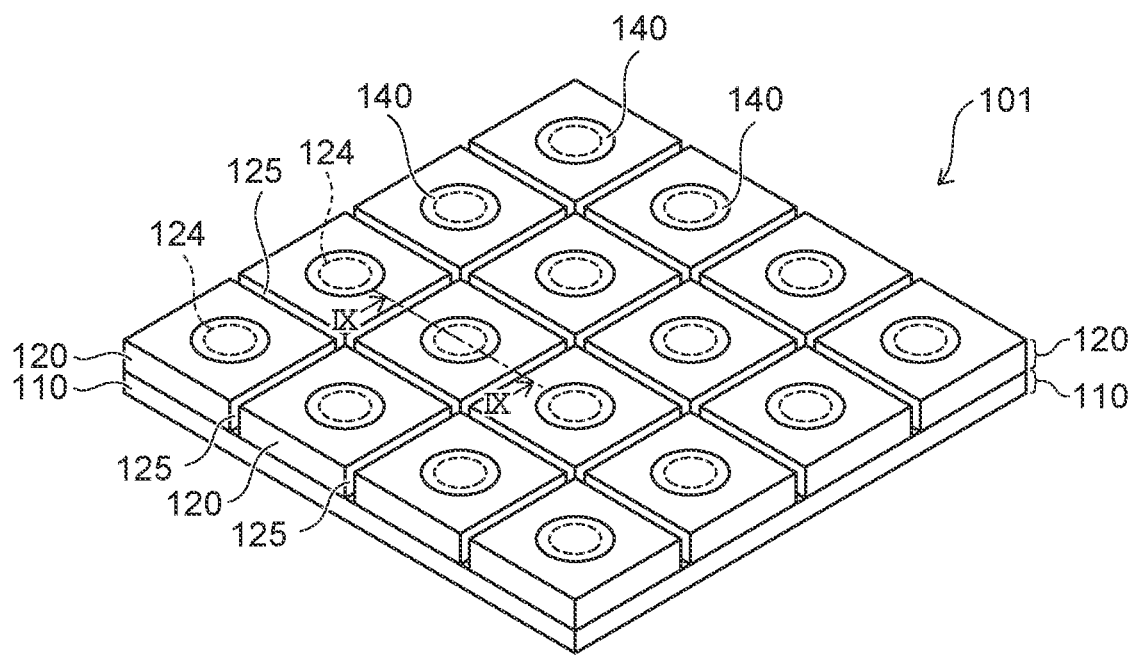
FIG. 8 is a perspective view showing an exemplary planar light source according to a fifth embodiment of the present disclosure.

FIG. 8 is a perspective view showing an exemplary planar light source according to the fifth embodiment.

Figure 9:
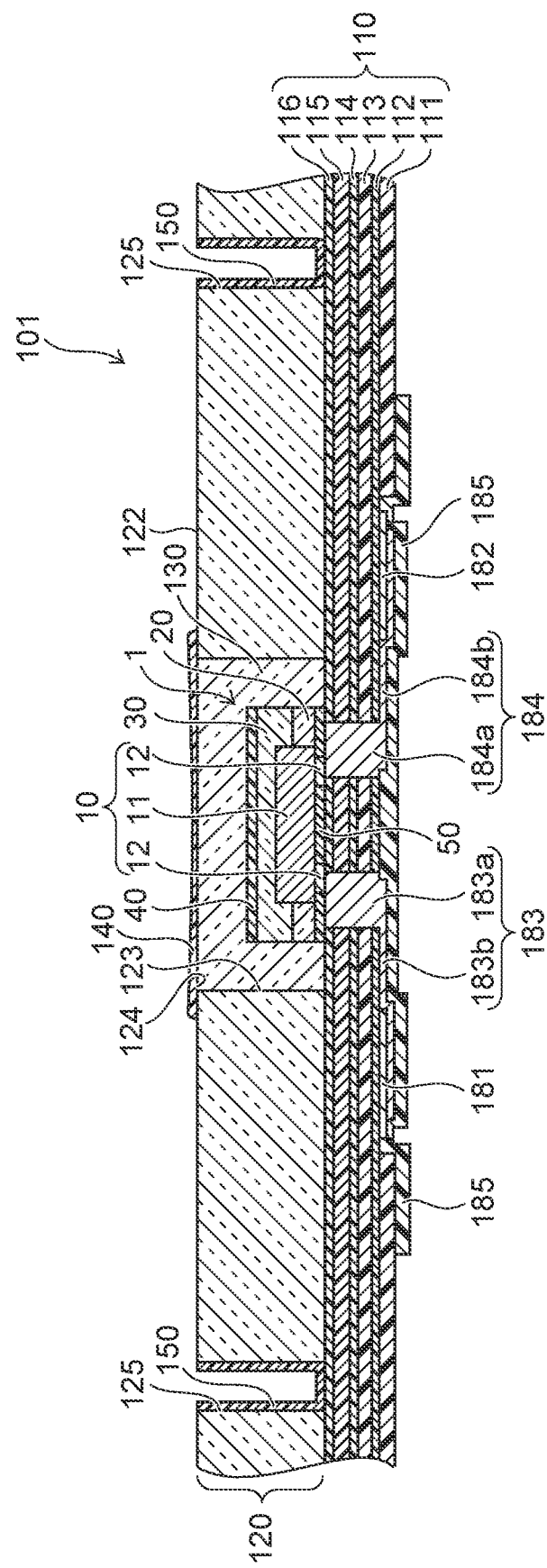
FIG. 9 is a cross-sectional view along line IX-IX shown in FIG. 8.

FIG. 9 is a cross-sectional view along line IX-IX shown in FIG. 8.

As shown in FIGS. 8 and 9, the planar light source 101 according to the embodiment includes the wiring substrate 110, a light guide plate 120, and the multiple light-emitting devices 1.

The configuration of the light-emitting device 1 is as described in the first embodiment. The light-emitting device 2 according to the second embodiment, the light-emitting device 3 according to the third embodiment, or the light-emitting device 4 according to the fourth embodiment may be used as the light-emitting device instead of the light-emitting device 1 according to the first embodiment. Also, multiple types of light-emitting devices may be used.

The light guide plate 120 is located on the wiring substrate 110. The light guide plate 120 includes a major surface 121 (the lower surface) at the wiring substrate 110 side, and a major surface 122 (the upper surface) at the side opposite to the wiring substrate 110. The light guide plate 120 includes multiple holes 123. According to the embodiment, the hole 123 extends through the light guide plate 120 in the thickness direction. The hole 123 has an opening 124 at the major surface 122 (the upper surface) of the light guide plate 120. As described below, the hole 123 may not extend through the light guide plate 120. The multiple light-emitting devices 1 are positioned respectively inside the multiple holes 123. The hole 123 is, for example, circular columnar, rectangular-prism-shaped, or rectangular-prism-shaped with rounded corners. However, the side surface of the hole 123 is not limited to a perpendicular surface and may be a tapered surface. The side surface of the hole 123 means a surface that defines the hole 123.

A light-transmitting member 130 that covers the light-emitting device 1 is located inside the hole 123. The material of the light-transmitting member 130 is, for example, an epoxy resin, a silicone resin, etc. The light-transmitting member 130 may or may not include a wavelength conversion material.

The planar light source 101 includes a second light-reflective member 140 that covers the opening 124. The second light-reflective member 140 reflects a portion of the light emitted from the light-emitting device 1 and transmits another portion. The second light-reflective member 140 is, for example, discal. The end portion of the second light-reflective member 140 is located on the light guide plate 120. The central portion of the second light-reflective member 140 is located on the light-transmitting member 130. The second light-reflective member 140 may be located only on the light-transmitting member 130.

The light guide plate 120 includes a partitioning trench 125 that surrounds at least one of the light-emitting devices 1 in a plan view. The partitioning trench 125 is, for example, lattice-shaped in the plan view. The partitioning trench 125 may extend through the light guide plate 120 in the thickness direction, may be located only at the major surface 122 side, or may be located only at the major surface 121 side. FIGS. 8 and 9 show an example in which the partitioning trench 125 extends through the light guide plate 120. The side surface of the partitioning trench 125 may be a perpendicular surface or may include a step. When a step is provided, the major surface 122 side may be wider than the major surface 121 side; or, the major surface 121 side may be wider than the major surface 122 side. FIGS. 8 and 9 show an example in which the side surface of the partitioning trench 125 is a perpendicular surface. A light-reflective partitioning member 150 is located at the inner surface of the partitioning trench 125. The material of the partitioning member 150 is, for example, a metal or a resin that includes a light-diffusing material.

The light-emitting devices 1 are electrically connected to the wiring substrate 110. A first cover layer 111, a support layer 112, a second cover layer 113, a first adhesive sheet 114, a light-reflective sheet 115, and a second adhesive sheet 116 are stacked in the wiring substrate 110 in this order upward from below. The second adhesive sheet 116 contacts the major surface 121 (the lower surface) of the light guide plate 120. The first cover layer 111 is not located in the region directly under the light-emitting device 1 and at the periphery of the region directly under the light-emitting device 1; and the support layer 112 is exposed.

A first wiring layer 181 and a second wiring layer 182 are located at the lower surface of the support layer 112 in the regions where the support layer 112 is exposed. A first interconnect member 183 that connects the first wiring layer 181 to one electrode 12 of the light-emitting device 1 is provided, and a second interconnect member 184 that connects the second wiring layer 182 to the other electrode 12 of the light-emitting device 1 is provided.

The first interconnect member 183 includes a first portion 183a and a second portion 183b. The first portion 183a extends through the support layer 112, the second cover layer 113, the first adhesive sheet 114, the light-reflective sheet 115, and the second adhesive sheet 116 and contacts the one electrode 12. The second portion 183b covers the lower surface of the first portion 183a and the lower surface of the first wiring layer 181 and connects the first portion 183a to the first wiring layer 181. Similarly, the second interconnect member 184 includes a third portion 184a and a fourth portion 184b. The third portion 184a extends through the support layer 112, the second cover layer 113, the first adhesive sheet 114, the light-reflective sheet 115, and the second adhesive sheet 116 and contacts the other electrode 12. The fourth portion 184b covers the lower surface of the third portion 184a and the lower surface of the second wiring layer 182 and connects the third portion 184a to the second wiring layer 182. The first interconnect member 183 and the second interconnect member 184 are formed by curing a conductive paste.

A cover layer 185 is located at the wiring substrate 110. The cover layer 185 covers the lower surface of the exposed region of the support layer 112, the lower surface of the first wiring layer 181, the lower surface of the second wiring layer 182, the lower surface of the second portion 183b, the lower surface of the fourth portion 184b, and the lower surface of the first cover layer 111 at the vicinity of the exposed region of the support layer 112.

Operations of the planar light source according to the embodiment will now be described.

As shown in FIG. 9, the light that is emitted from the light-emitting device 1 enters the light guide plate 120 via the light-transmitting member 130, propagates in a substantially horizontal direction through the light guide plate 120, and is emitted from the major surface 122 (the upper surface) of the light guide plate 120.

Effects of the embodiment will now be described.

For example, the planar light source 101 can be used as a backlight of a display device. In such a case, it is favorable for the light emitted from the planar light source 101 to include light that can efficiently pass through the color filters of the display device. The utilization efficiency of the light of the display device is increased by setting the first peak wavelength of the first light L1, the second peak wavelength of the second light L2, and the third peak wavelength of the third light L3 to wavelengths that can efficiently pass through the color filters of the display device.

In the light-emitting device 1 as described in the first embodiment, the extraction efficiency of the second light L2 and the third light L3 from the side surface 1S is high. Therefore, the portions of light of the second light L2 and the third light L3 that are emitted in a substantially horizontal direction easily propagate far through the light guide plate 120. The luminous efficiency of the planar light source 101 is increased thereby. Also, the uniformity of the light emitted from the major surface 122 (the upper surface) of the light guide plate 120 is high.

Sixth Embodiment

This embodiment also is an embodiment of a planar light source.

Figure 10:
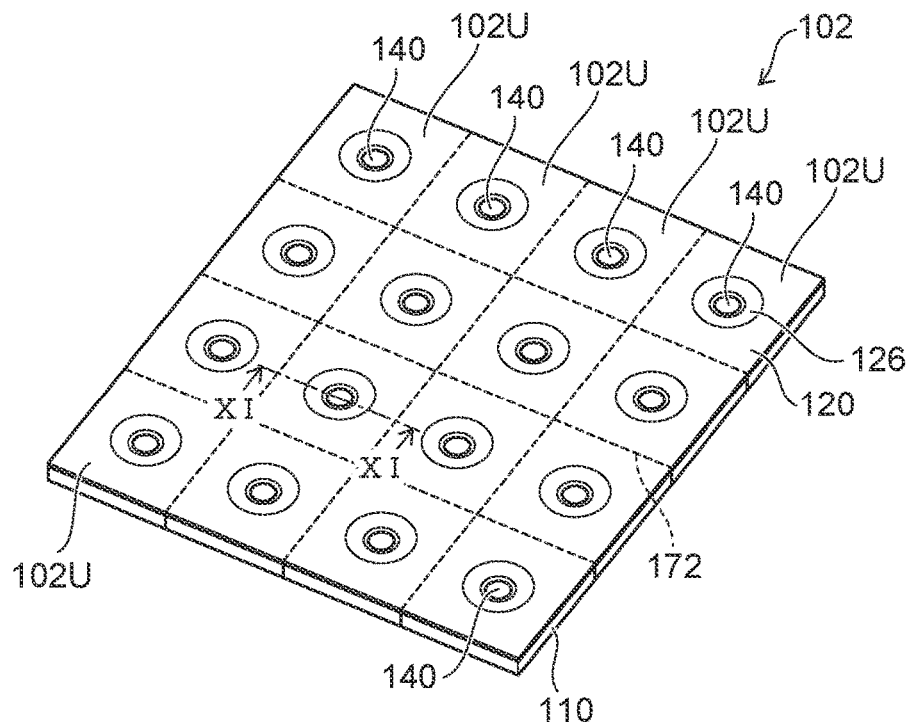
FIG. 10 is a perspective view showing an exemplary planar light source according to a sixth embodiment of the present disclosure.
Figure 11:
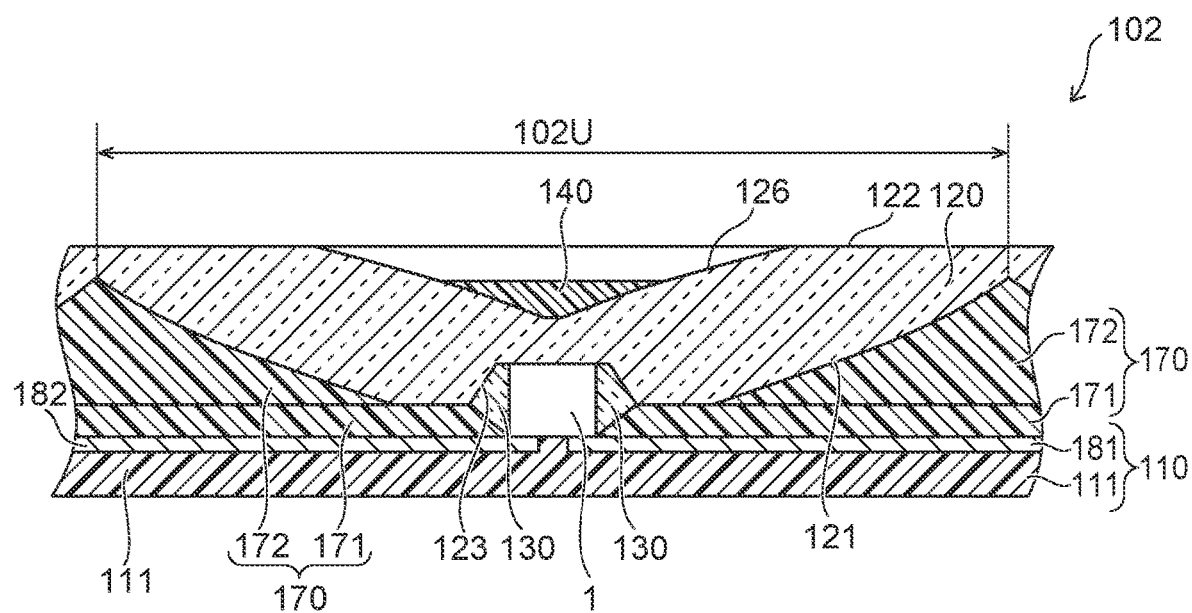
FIG. 11 is a cross-sectional view along line XI-XI shown in FIG. 10.

FIG. 10 is a perspective view showing an exemplary planar light source according to the sixth embodiment. FIG. 11 is a cross-sectional view along line XI-XI shown in FIG. 10.

In the planar light source 102 according to the embodiment as shown in FIGS. 10 and 11, a third light-reflective member 170 is located between the wiring substrate 110 and the light guide plate 120. Also, the hole 123 of the light guide plate 120 is located only at the major surface 121 (the lower surface) side of the light guide plate 120 and does not extend through the light guide plate 120. The light-emitting device 1 is located in the hole 123. The configuration of the light-emitting device 1 is similar to the light-emitting device 1 according to the first embodiment.

The third light-reflective member 170 includes a first portion 171 located at the periphery of the lower portion of the light-emitting device 1, and a second portion 172 located on the first portion 171. For example, the first portion 171 and the second portion 172 include the same material. The first portion 171 is located over the entire planar light source 102 other than the light-emitting device 1. The second portion 172 surrounds the light-emitting device 1 in a plan view and is separated from the light-emitting device 1. The height of the upper surface of the second portion 172 from the first portion 171 when viewed in cross-section increases away from the light-emitting device 1. Thereby, the upper surface of the third light-reflective member 170 forms a concave surface surrounding the light-emitting device 1. A light-emitting region 102U is partitioned by the ridge of the second portion 172.

The major surface 121 (the lower surface) of the light guide plate 120 is curved according to the shape of the second portion 172 of the third light-reflective member 170. A recess 126 is located in the region of the major surface 122 (the upper surface) of the light guide plate 120 that includes the region directly above the hole 123. The second light-reflective member 140 is located in the recess 126. The shape of the second light-reflective member 140 is, for example, an inverted circular cone. The shape of the second light-reflective member 140 is not limited to an inverted circular cone. The tip of the second light-reflective member 140 at the light-emitting device 1 side may not be sharp. The surface of the second light-reflective member 140 at the light-emitting device 1 side may be a flat surface or a curved surface.

Although an example is shown in the embodiment in which the light-emitting device 1 according to the first embodiment is used as the light-emitting device, the light-emitting device is not limited thereto; the light-emitting device 2 according to the second embodiment, the light-emitting device 3 according to the third embodiment, or the light-emitting device 4 according to the fourth embodiment may be included. Also, a mixture of multiple types of light-emitting devices may be used.

Materials of Members

Examples of materials of the members of the planar light sources according to embodiments described above will now be described.

The semiconductor structure body 11 can include at least one light-emitting layer configured to emit light emission colors such as those described above. For example, the semiconductor structure body 11 can include a light-emitting layer configured to emit one light emission color between the n-type semiconductor layer and the p-type semiconductor layer.

The light-emitting layer is configured to emit visible light or ultraviolet light. For example, at least blue light to red light are examples of visible light. The semiconductor structure body that includes such a light-emitting layer can include, for example, $In_xAl_yGa_{1-x-y}N$ ($0 \leq x$, $0 \leq y$, and $x+y \leq 1$).

The light-emitting layer may have a structure that includes a single active layer such as a double heterostructure or a single quantum well structure (SQW), or may have a structure that includes an active layer group such as a multi-quantum well structure (MQW).

The semiconductor structure body 11 can include multiple light-emitting layers. For example, the semiconductor structure body may have a structure that includes multiple light-emitting layers between the n-type semiconductor layer and the p-type semiconductor layer. Multiple repeated structures that each include an n-type semiconductor layer, a light-emitting layer, and a p-type semiconductor layer in this order may be used. The multiple light-emitting layers may include active layers having different light emission colors and active layers having the same light emission color. The light emission colors being the same means that there may be fluctuation within a range that can be considered to be the same light emission color in use, e.g., about several nm at the peak wavelength. A combination of the light emission colors can be selected as appropriate. For example, blue light and blue light, green light and green light, red light and red light, ultraviolet light and ultraviolet light, blue light and green light, blue light and red light, green light and red light, etc., are examples of combinations of the light emission colors when the semiconductor structure body includes two active layers.

A fluorescer can be used as the wavelength conversion material 22 of the first wavelength conversion member 20, the wavelength conversion material 32 of the second wavelength conversion member 30, and the wavelength conversion material of the third wavelength conversion member 60. An yttrium-aluminum-garnet-based fluorescer (e.g., $Y_3(Al, Ga)_5O_{12}:Ce$), a lutetium-aluminum-garnet-based fluorescer (e.g., $Lu_3(Al, Ga)_5O_{12}:Ce$), a terbium-aluminum-garnet-based fluorescer (e.g., $Tb_3(Al, Ga)_5O_{12}:Ce$), a nitride-based fluorescer such as a β-sialon fluorescer (e.g., $(Si, Al)_3(O, N)_4:Eu$), an α-sialon fluorescer (e.g., $M_z(Si, Al)_{12}(O, N)_{16}$ (in which $0<z\leq2$, and M is a lanthanide element other than Li, Mg, Ca, Y, La, and Ce)), a CASN-based fluorescer (e.g., $CaAlSiN_3:Eu$), a SCASN-based fluorescer (e.g., $(Sr, Ca)AlSiN_3:Eu$), or the like, a fluoride-based fluorescer such as a KSF-based fluorescer (e.g., $K_2SiF_6:Mn$), a KSAF-based fluorescer (e.g., $K_2(Si, Al)F_6:Mn$), a MGF-based fluorescer (e.g., $3.5MgO \cdot 0.5MgF_2 \cdot GeO_2:Mn$), or the like, a quantum dot fluorescer, etc., can be used as such a fluorescer. One type of fluorescer or multiple types of fluorescers may be used as the wavelength conversion material.

The first light-reflective member 40, the second light-reflective member 140, and the third light-reflective member 170 include, for example, resins that include light-diffusing materials. The resins that include the light-diffusing materials can be white as an entirety. The resin can include, for example, a silicone resin or an epoxy resin. The light-diffusing material can include, for example, titanium oxide, silica, alumina, zinc oxide, glass, etc. Such a light-reflective member has a reflectance that is not less than 60% for the light emitted from the light-emitting device.

The light-diffusing material content may be the same or different between the first light-reflective member 40, the second light-reflective member 140, and the third light-reflective member 170. The light guide plate 120 includes a transmissive material. For example, a thermoplastic resin such as an acrylic resin, a polycarbonate resin, a cyclic polyolefin resin, a polyethylene terephthalate resin, a polyester resin, or the like, a thermosetting resin such as an epoxy resin, a silicone resin, or the like, glass, etc., can be used.

For example, embodiments of the disclosure can be utilized in light sources of lighting devices, display devices, etc.

What is claimed is:

1. A light-emitting device, comprising:
a light-emitting element emitting a first light having a first peak wavelength;
a first wavelength conversion member contacting a side surface of the light-emitting element, the first wavelength conversion member including a wavelength conversion material that absorbs at least a portion of the first light and emits a second light having a second peak wavelength different from the first peak wavelength;
a second wavelength conversion member located on the first wavelength conversion member, the second wavelength conversion member including a wavelength conversion material that absorbs at least a portion of the first light and emits a third light having a third peak wavelength different from the first peak wavelength and the second peak wavelength; and
a first light-reflective member located on the second wavelength conversion member, the first light-reflective member being located at least in a region directly above the light-emitting element,
a side surface of the first wavelength conversion member and a side surface of the second wavelength conversion member being included in a continuous light-emitting surface.

2. The device according to claim 1, wherein
the second wavelength conversion member is located on the light-emitting element.

3. The device according to claim 2, wherein
the second wavelength conversion member contacts the side surface and an upper surface of the light-emitting element.

4. The device according to claim 2, wherein
the second wavelength conversion member contacts an upper surface of the light-emitting element.

5. The device according to claim 2, wherein
the second wavelength conversion member is separated from the light-emitting element.

6. The device according to claim 1, wherein
the second wavelength conversion member includes a fluoride fluorescer.

7. The device according to claim 6, wherein
the second wavelength conversion member includes a KSF fluorescer.

8. The device according to claim 1, wherein
the first peak wavelength is in a visible light region.

9. The device according to claim 1, further comprising:
a third wavelength conversion member located between the second wavelength conversion member and the first light-reflective member, the third wavelength conversion member absorbing the first light and emitting a fourth light,
the fourth light having a fourth peak wavelength different from the first peak wavelength, the second peak wavelength, and the third peak wavelength,
the first peak wavelength being in an ultraviolet region.

10. The device according to claim 1, wherein
the light-emitting element includes a pair of electrodes at a lower surface of the light-emitting element.

11. The device according to claim 10, further comprising:
a cover member covering a lower surface of the first wavelength conversion member and covering a region of the lower surface of the light-emitting element other than the electrodes.

12. The device according to claim 11, wherein
the cover member is light-reflective.

13. The device according to claim 1, wherein
an outer surface of the light-emitting device includes the continuous light-emitting surface.

14. A planar light source, comprising:
a plurality of light-emitting devices; and
a light guide plate including a plurality of holes,
the plurality of light-emitting devices each including
a light-emitting element emitting a first light having a first peak wavelength,
a first wavelength conversion member contacting a side surface of the light-emitting element, the first wavelength conversion member including a wavelength conversion material that absorbs at least a portion of the first light and emits a second light having a second peak wavelength different from the first peak wavelength,
a second wavelength conversion member located on the first wavelength conversion member, the second wavelength conversion member including a wavelength conversion material that absorbs at least a portion of the first light and emits a third light having a third peak wavelength different from the first peak wavelength and the second peak wavelength, and
a first light-reflective member located on the second wavelength conversion member, the first light-reflective member being located at least in a region directly above the light-emitting element,
a side surface of the first wavelength conversion member and a side surface of the second wavelength conversion member being included in a continuous light-emitting surface, and
the plurality of light-emitting devices being positioned respectively in the plurality of holes.

15. The planar light source according to claim 14, further comprising:
a wiring substrate electrically connected to the plurality of light-emitting devices,
the light guide plate being located on the wiring substrate.

16. The planar light source according to claim 14, wherein
at least one of the plurality of holes has an opening at a major surface of the light guide plate at a side opposite to the wiring substrate, and
the planar light source further includes a second light-reflective member covering the opening.

17. The planar light source according to claim 14, wherein
the light guide plate includes a partitioning trench surrounding at least one of the plurality of light-emitting devices in a plan view.

18. The planar light source according to claim 14, wherein
an outer surface of the light-emitting device includes the continuous light-emitting surface.

\* \* \* \* \*